United States Patent [19]
Nilssen

[11] Patent Number: 5,479,074
[45] Date of Patent: Dec. 26, 1995

[54] ELECTRONIC BALLAST WITH PRE-CONDITIONER CIRCUIT

[76] Inventor: Ole K. Nilssen, Caesar Dr., Barrington, Ill. 60010

[21] Appl. No.: 994,288

[22] Filed: Dec. 21, 1992

Related U.S. Application Data

[63] Continuation-in-part of Ser. No. 973,764, Nov. 9, 1992, Ser. No. 820,918, Jan. 15, 1992, and Ser. No. 895,710, Jun. 9, 1992, which is a continuation-in-part of Ser. No. 856,392, Mar. 23, 1992, which is a continuation-in-part of Ser. No. 734,188, Jul. 22, 1991, which is a continuation-in-part of Ser. No. 787,692, Oct. 15, 1985, which is a continuation of Ser. No. 644,155, Aug. 27, 1984, which is a continuation of Ser. No. 178,107, Aug. 14, 1980, said Ser. No. 820,918is a continuation-in-part of Ser. No. 281,275, Dec. 8, 1988, which is a continuation-in-part of Ser. No. 80,365, Aug. 3, 1987, Pat. No. 4,819,146.

[51] Int. Cl.$^6$ .................................................. H05B 37/00
[52] U.S. Cl. ................... 315/209 R; 315/307; 315/219; 315/DIG. 7; 315/244
[58] Field of Search ................................. 315/209, 307, 315/DIG. 7, 219, 244

[56] References Cited

U.S. PATENT DOCUMENTS 4,641,061  2/1987  Munson ........................ 315/209 R X
4,709,189  11/1987  Kuchii ............................... 315/209 R Primary Examiner—Robert J. Pascal
Assistant Examiner—Reginald A. Ratliff

[57] ABSTRACT

In an electronic ballast, a series-resonance-loaded half-bridge inverter is powered from a DC voltage and provides an AC voltage at an AC rail across which are connected plural lamp-ballast series-combinations, with each lamp-ballast series-combination consisting of a current-limiting capacitor series-connected with an instant-start fluorescent lamp. The DC voltage, which is obtained via a pre-converter, is controlled so as to maintain a predetermined magnitude even during the lamp ignition process. The 35 kHz AC voltage is generated by the half-bridge inverter powering a series-tuned L-C circuit near its natural resonance frequency. The AC rail is connected across the tank-capacitor of the L-C circuit. Except for being reduced so as to maintain total lamp current below a predetermined level on a sustained basis, the magnitude of the AC voltage is controlled to a given level in response to an AC control action applied to an AC control input.

39 Claims, 4 Drawing Sheets

(Pre-Converter Circuit)

(Inverter Circuit)

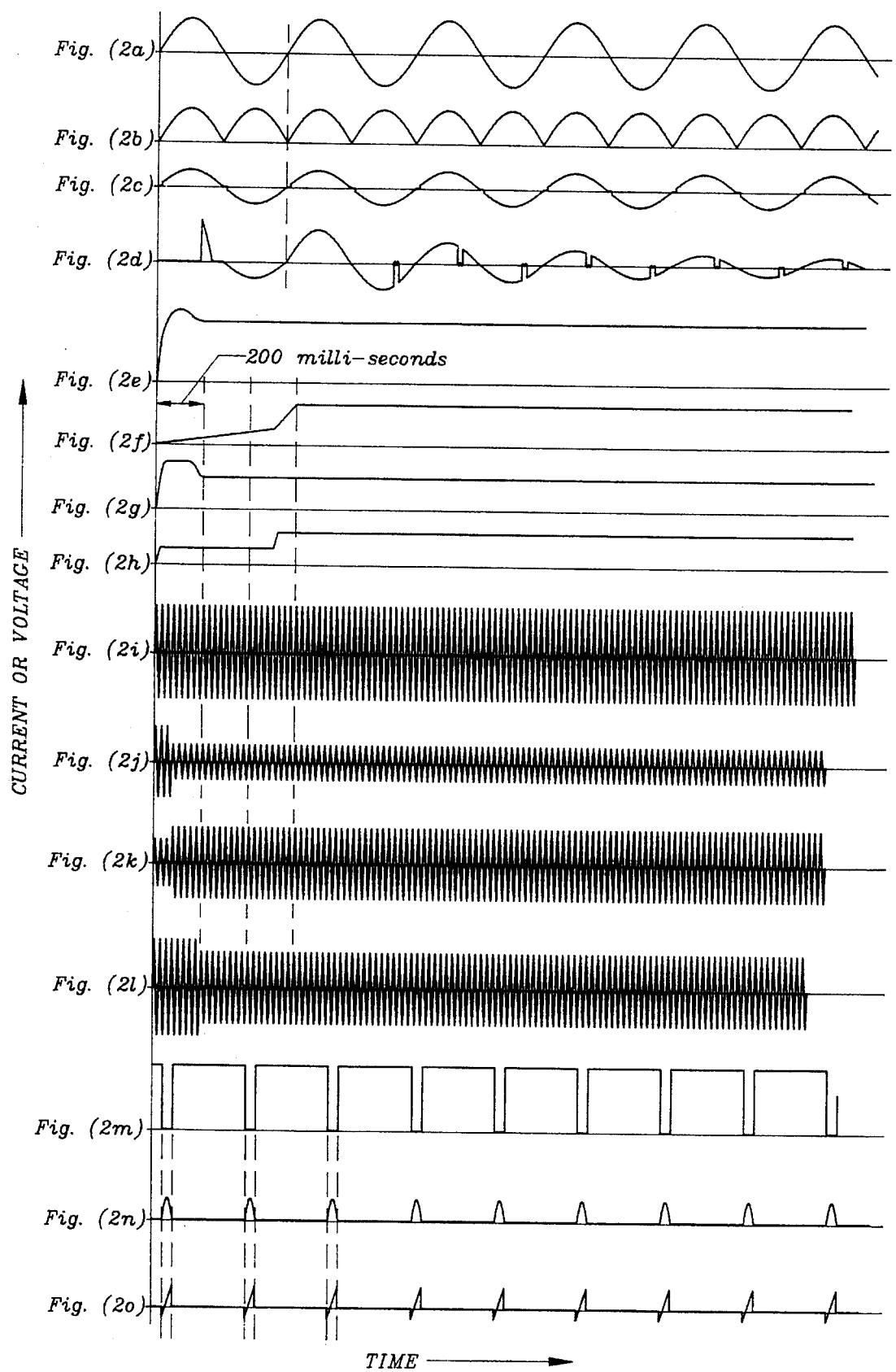

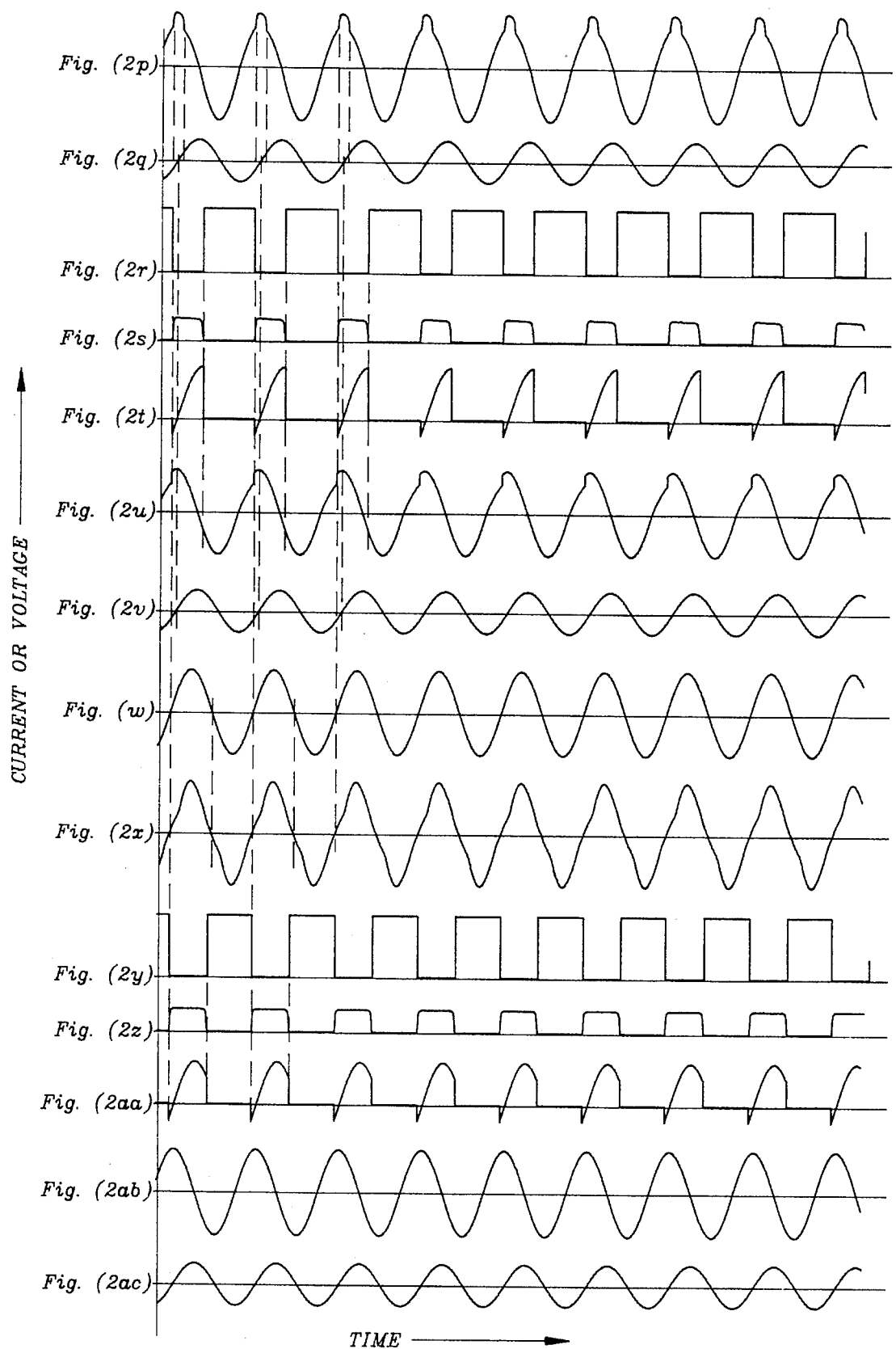

ELECTRONIC BALLAST WITH PRE-CONDITIONER CIRCUIT

RELATED APPLICATIONS

The present application is a Continuation-in-Part of application Ser. No. 07/973,764 filed Nov. 9, 1992.

The present application is also a Continuation-in-Part of application Ser. No. 07/820,918 filed Jan. 15, 1992; which is a Continuation-in-Part of application Ser. No. 07/281,275 filed Dec. 8, 1988; which is a Continuation-in-Part of application Ser. No. 07/880,865 filed Aug. 3, 1987.

The present application is also a Continuation-in-Part of application Ser. No. 07/895,710 filed Jun. 9, 1992; which is a Continuation-in-Part of application Ser. No. 07/856,392 filed Mar. 23, 1992; which is a Continuation-in-Part of application Ser. No. 07/734,188 filed Jul. 22. 1991; which is a Continuation-in-Part of application Ser. No. 06/787,692 filed Oct. 15, 1985; which is a Continuation of application Ser. No. 06/644,155 filed Aug. 27, 1984; which is a Continuation of application Ser. No. 06/178,107 filed Aug. 14, 1980.

FIELD OF INVENTION

This invention relates to ballasts for gas discharge lamps, particularly to electronic ballasts having a pre-converter for establishing a controlled DC supply voltage and an inverter circuit operative to power plural parallel-connected instant-start fluorescent lamps with high-frequency current.

SUMMARY OF THE INVENTION

Objects of the Invention

A main object of the present invention is that of providing cost-effective ballasting means for gas discharge lamps.

This as well as other objects, features and advantages of the present invention will become apparent from the following description and claims.

BRIEF DESCRIPTION OF THE INVENTION

In a power-line-operated electronic ballast, a series-resonance-loaded half-bridge inverter is powered from a DC voltage and provides a high-frequency (35 kHz) AC voltage at an AC rail across which are connected plural lamp-ballast series-combinations, with each lamp-ballast series-combination consisting of a current-limiting capacitor series-connected with an instant-start fluorescent lamp.

The DC voltage is obtained by way of a pre-converter and is controlled so as to exhibit a predetermined magnitude even during the lamp ignition process. The AC voltage is generated by the half-bridge inverter powering a series-tuned L-C circuit near its natural resonance frequency. The AC rail is connected across the tank-capacitor of the L-C circuit.

Except for being reduced so as to maintain total lamp current below a predetermined level on a sustained basis, the magnitude of the AC voltage is controlled to a given level in response to an AC control action applied to an AC control input.

BRIEF DESCRIPTION OF THE DRAWINGS

FIGS. 2(a)–2(ac) represent magnitude-versus-time illustrations of various significant voltages and currents occurring in the circuit of FIG. 1.

DESCRIPTION OF THE PREFERRED EMBODIMENT

Details of Construction

Figure 1A:
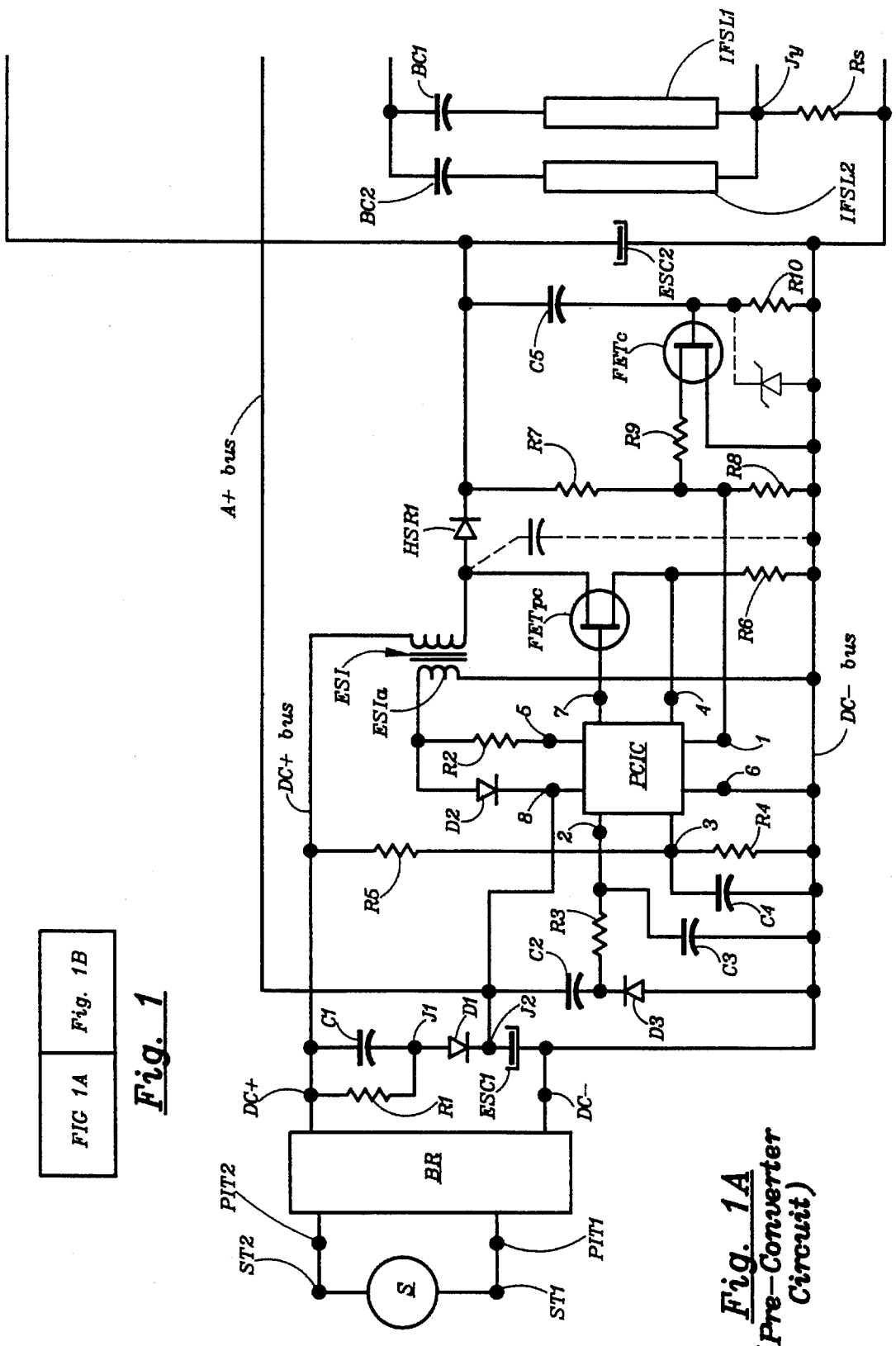
FIG. 1 is a schematic circuit diagram of the preferred embodiment of the invention.
Figure 1B:
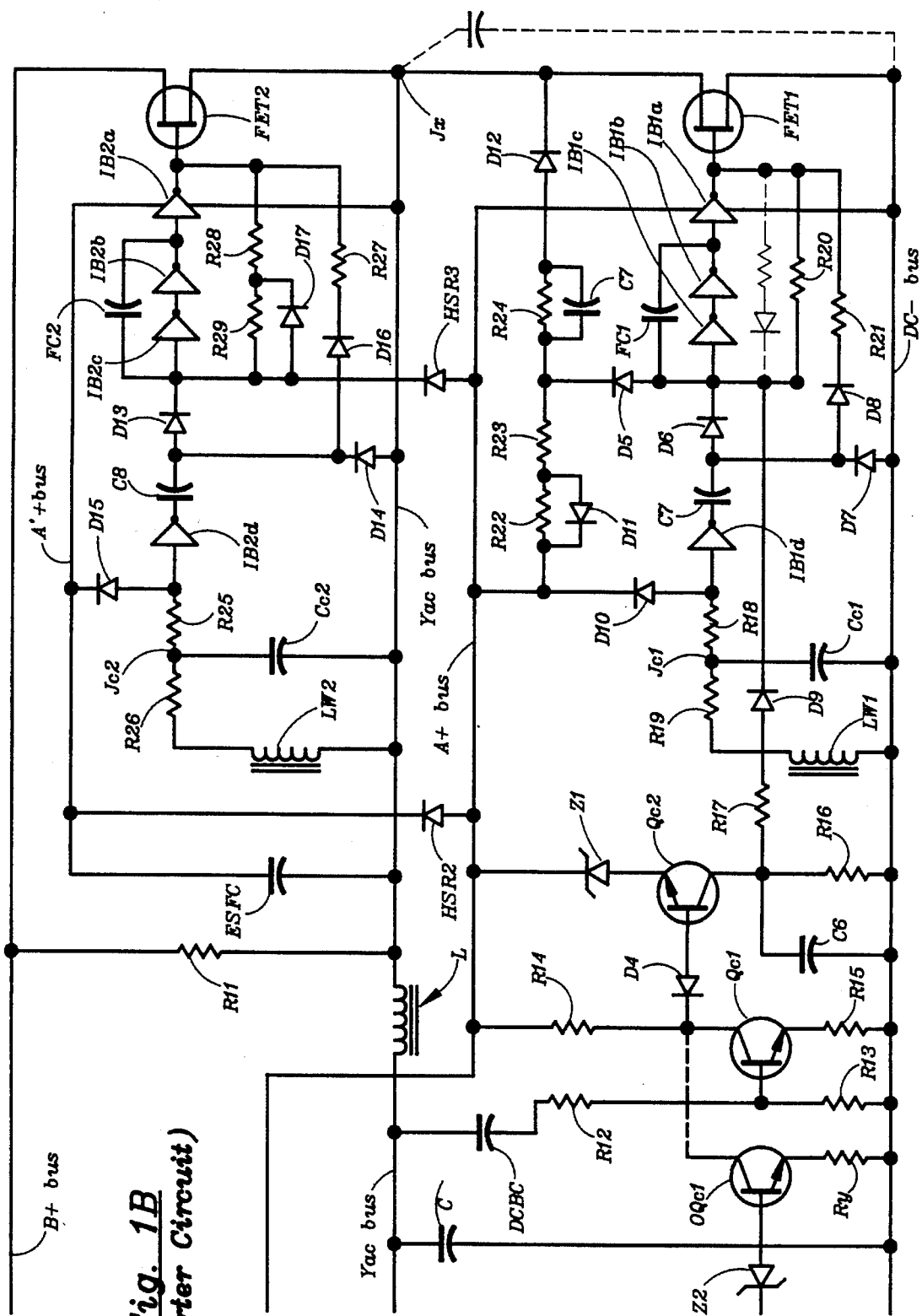

FIG. 1 is a schematic diagram of the preferred embodiment of the invention.

In FIG. 1, an ordinary electric utility power line is represented by a source S, whose source terminals ST1 and ST2 are connected with a pair of power input terminals PIT1 and PIT2 of a bridge rectifier BR; which bridge rectifier BR has two DC output terminals DC– and DC+ connected respectively with a DC– bus and a DC+ bus.

A resistor R1 and a capacitor C1 are each connected between the DC+ bus and a junction J1; a diode D1 is connected with its anode to junction J1 and with its cathode to a junction J2. An energy-storing capacitor ESC1 is connected between junction J2 and the DC– bus.

A pre-converter PCIC is an integrated circuit (Motorola MC 34262) and has eight terminals 1–8. Terminal 8 is connected with an A+ bus; which A+ bus is also connected with junction J2 as well as with the cathode of a diode D2. A resistor R2 is connected between the anode of diode D2 and terminal 5 of PCIC. An auxiliary winding ESIa on an energy-storing inductor ESI is connected between the anode of diode D2 and the DC– bus.

A capacitor C2 is connected between junction J2 and the cathode of a diode D3, whose anode is connected with the DC– bus. A resistor R3 is connected between the cathode of diode D3 and terminal 2 of PCIC. A capacitor C3 is connected between terminal 2 and the DC– bus.

Each of a capacitor C4 and a resistor R4 is connected between terminal 3 of PCIC the DC– bus. A resistor R5 is connected between terminal 3 of PCIC and the DC+ bus. Terminal 6 of PCIC is connected directly with the DC– bus. Terminal 7 of PCIC is connected with the gate terminal of a field-effect transistor FETpc, whose drain terminal is connected with the anode of a high-speed rectifier HSR1, and whose source terminal is connected with the DC– bus by way of a resistor R6. Energy-storing inductor ESI is connected between the DC+ bus and the drain terminal of FETpc.

The cathode of high-speed rectifier HSR1 is connected with a B+ bus; and an energy-storing capacitor ESC2 is connected between the B+ bus and the DC– bus. A resistor R7 is connected between the B+ bus and terminal 1 of PCIC; and a resistor R8 is connected between terminal 1 of PCIC and the DC– bus. A resistor R9 is connected between terminal 1 of PCIC and the drain terminal of a field-effect transistor FETc, whose source terminal is connected with the DC– bus and whose gate terminal is connected with the B+ bus by way of a capacitor C5. A resistor R10 is connected between the gate terminal of FETc and the DC– bus.

The source terminal of a field-effect transistor FET1 is connected with the DC– bus, while its drain terminal is connected with a junction Jx as well as with the source terminal of a field-effect transistor FET2, whose drain terminal is connected with the B+ bus. Junction Jx is connected with an Xac bus.

A tank inductor L is connected between the Xac bus and a Yac bus; while a tank capacitor C is connected between the Yac bus and the DC– bus. A resistor R11 is connected between the xac bus and the B+ bus.

A first instant-start fluorescent lamp ISFL1 is connected in series with a first ballast capacitor BC1 to form a first series-combination; which first series-combination is connected between the Yac bus and a junction Jy.

A second instant-start fluorescent lamp ISFL2 is connected in series with a second ballast capacitor BC2 to form a second series-combination; which second series-combination is also connected between the Yac bus and junction Jy.

A lamp current sensing resistor Rs is connected between junction Jy and the DC− bus.

A DC blocking capacitor DCBC and a resistor R12 are series-connected between the Yac bus and the base terminal of a control transistor Qc1; while a resistor R13 is connected between this base terminal and the DC− bus. The collector terminal of transistor Qc1 is connected with the A+ bus by way of a resistor R14; while the emitter terminal of transistor Qc1 is connected with the DC− bus by way of a resistor R15. The cathode of a diode D4 is connected with the collector of transistor Qc1; while the anode of diode D4 is connected with the base terminal of a transistor Qc2, whose emitter terminal is connected with the anode of a Zener diode Z1, whose cathode is connected with the A+ bus. Each of a resistor R16 and a capacitor C6 is connected between the DC− bus and the collector terminal of transistor Qc2.

An inverting buffer IB1a has its output terminal connected with the gate terminal of FET1, while its input terminal is connected with the output terminal of another inverting buffer IB1b, whose input terminal is connected with the output terminal of still another inverting buffer IB1c. A feedback capacitor FC1 is connected between the output terminal of IB1b and the input terminal of IB1c. The input terminal of IB1c is connected with the anode of a diode D5 and with the cathode of a diode D6, whose anode is connected with the cathode of a diode D7 and with the anode of a diode D8. The input terminal of IB1c is also connected with the cathode of a diode D9, whose anode is connected with the collector of transistor Qc2 by way of a resistor R17.

A capacitor C7 is connected between the anode of diode D6 and the output terminal of yet another inverting buffer IB1d, whose input terminal is connected with the anode of a diode D10, whose cathode is connected with the A+ bus.

A resistor R18 is connected between the input terminal of IB1d and a junction Jc1; a capacitor Cc1 is connected between junction Jc1 and the DC− bus; and a resistor R19 is connected between junction Jc1 and one terminal of a winding LW1 whose other terminal is connected with the DC− bus. Winding LW1 is tightly coupled with tank inductor L.

A resistor R20 is connected between the input terminal of IB1c and the output terminal of IB1a. A resistor R21 is connected between the cathode of diode D8 and the output terminal of IB1a; a resistor R22 is connected between the cathode and the anode of a diode D11; a resistor R23 is connected between the anode of diode D11 and the cathode of diode D5; a resistor R24 is connected between the cathode of diode D5 and the anode of a diode D12, whose cathode is connected with the Xac bus; and a capacitor C7 is connected in parallel with resistor R24.

Each of inverting buffers IB1a, IB1b, IB1c and IB1d is part of a single packaged integrated circuit, such as the Motorola MC14049UB hex inverter/buffer; and, although connections are only shown for IB1a, each of these inverting buffers is connected with the DC supply voltage provided between the DC− bus and the A+ bus.

A high-speed rectifier HSR2 is connected with its anode to the A+ bus and with its cathode to a A'+ bus. An energy-storing filter capacitor ESFC is connected between the Xac bus and the A'+ bus.

An inverting buffer IB2a has its output terminal connected with the gate terminal of FET2, while its input terminal is connected with the output terminal of another inverting buffer IB2b, whose input terminal is connected with the output terminal of still another inverting buffer IB2c. A feedback capacitor FC2 is connected between the output terminal of IB2b and the input terminal of IB2c. The input terminal of IB2c is connected with the cathode of a diode D13, whose anode is connected with the cathode of a diode D14, whose anode is connected with the Xac bus. A capacitor C8 is connected between the anode of diode D13 and the output terminal of yet another inverting buffer IB2d.

The input terminal of IB2d is connected with the anode of a diode D15, whose cathode is connected with the A'+ bus. A resistor R25 is connected between the anode of diode D15 and a junction Jc2; a resistor R26 is connected with junction Jc2 and, via winding LW2, with the Xac bus. A capacitor Cc2 is connected between junction Jc2 and the Xac bus.

A high-speed rectifier HSR3 is connected with its cathode to the input terminal of IB2c and with its anode to the A+ bus. The anode of a diode D16 is connected with the cathode of diode D14; while the cathode of diode D16 is connected with the output terminal of IB2a by way of a resistor R27. The input terminal of IB2c is connected with the anode of a diode D17, whose cathode is connected with the output terminal of IB2a via a resistor R28. A resistor R29 is connected in parallel with diode D17.

Each of inverting buffers IB2a, IB2b, IB2c and IB2d is part of a single packaged integrated circuit, such as the Motorola MC14049UB hex inverter/buffer; and, although connections are only shown for IB2a, each of these inverting buffers is connected with a DC voltage supplied between the Xac bus and the A'+ bus.

A transistor OQc1 is optionally connected with its collector terminal to the collector terminal of transistor Qc1, and with its emitter terminal to the DC− bus via a resistor Ry. The base of transistor OQc1 is connected to junction Jy by way of a Zener diode Z2.

Waveforms

To understand the operation of the circuit of FIG. 1, it is helpful to refer to various key voltage and current waveforms as they occur in different parts of the circuit. Some such waveforms are depicted by FIG. 2.

FIG. 2(a) illustrates the waveform of the 120 Volt/60 Hz power line voltage provided from source S.

FIG. 2(b) illustrates the waveform of the unidirectional voltage existing at the output of bridge rectifier BR, between the DC− bus and the DC+ bus.

FIG. 2(c) illustrates the waveform of the current drawn from the power line (i.e., from source S) under a condition of steady-state full-load operation.

FIG. 2(d) illustrates the waveform of the current drawn from the power line (i.e., from source S) under a condition existing just after power-up (i.e., just after the power line voltage has been applied to rectifier BR; during which condition the instant-start fluorescent lamps are in the process of igniting).

FIG. 2(e) illustrates, for instant preferred circuit, the instantaneous magnitude of the DC voltage provided to the preconverter IC (PCIC) during a brief period just after power-up.

FIG. 2(f) illustrates the instantaneous magnitude of the DC voltage provided to the pre-converter IC in prior art circuits during a brief period just after power-up.

FIG. 2(g) illustrates the instantaneous magnitude of the DC voltage at the B+ bus during a brief period just after power-up.

FIG. 2(h) illustrates the instantaneous magnitude of the DC voltage at the B+ bus during a brief period just after power-up in arrangements using prior art pre-conditioner circuits.

FIG. 2(i) illustrates the high-frequency voltage present across the tank-capacitor (i.e., the AC rail voltage) during a brief period after power up.

FIG. 2(j) illustrates the high-frequency voltage present across one of the instant-start fluorescent lamps during a brief period after power-up.

FIG. 2(k) illustrates the high-frequency current flowing through one of the instant-start fluorescent lamps during a brief period after power-up.

FIG. 2(l) illustrates, when applying optional control of maximum total lamp current, the high-frequency voltage present across the tank-capacitor during a brief period after power-up.

FIG. 2(m) shows the waveform of the voltage present across transistor FET1 (i.e., the voltage existing between the source and drain terminals of transistor FET1) during a situation when no load current is being drawn from the Yac bus (i.e., from the AC rail ).

FIG. 2(n) shows the waveform of the voltage present at the gate terminal of transistor FET1 (i.e., the voltage existing between the source and gate terminals of transistor FET1) during the situation when no load current is being drawn from the AC rail.

FIG. 2(o) shows the waveform of the current flowing through transistor FET1 (i.e., between the source and drain terminals of transistor FET1) during the situation when no load current is being drawn from the AC rail.

FIG. 2(p) shows the waveform of the voltage present across tank-inductor L during the situation when no load current is being drawn from the AC rail.

FIG. 2(q) shows the waveform of the voltage present at junction Jc1 (with reference to the DC– bus) during the situation when no load current is being drawn from the AC rail.

FIG. 2(r) shows the waveform of the voltage present across transistor FET1 during a situation when normal full-load power is being drawn from the AC rail.

FIG. 2(s) shows the waveform of the voltage present at the gate terminal of transistor FET1 during the situation when normal full-load power is being drawn from the AC rail.

FIG. 2(t) shows the waveform of the current flowing through transistor FET1 during the situation when normal full-load power is being drawn from the AC rail.

FIG. 2(u) shows the waveform of the voltage present across tank-inductor L during the situation when normal full-load power is being drawn from the AC rail.

FIG. 2(v) shows the waveform of the voltage present at junction Jc1 during the situation when normal full-load power is being drawn from the AC rail.

FIG. 2(w) shows the waveform of the current flowing through one of the fluorescent lamps during the situation when normal full-load power is being drawn from the AC rail.

FIG. 2(x) shows the waveform of the voltage present across one of the fluorescent lamps during the situation when normal full-load power is being drawn from the AC rail.

FIG. 2(y) shows the waveform of the voltage present across transistor FET1 during a situation when the fluorescent lamps are in the process of ignition, during which situation a much-higher-than-normal amount of power is being drawn from the AC rail.

FIG. 2(z) shows the waveform of the voltage present at the gate terminal of transistor FET1 during the situation when the fluorescent lamps are in the process of ignition.

FIG. 2(aa) shows the waveform of the current flowing through transistor FET1 during the situation when the fluorescent lamps are in the process of ignition.

FIG. 2(ab) shows the waveform of the voltage present across tank-inductor L during the situation when the fluorescent lamps are in the process of ignition.

FIG. 2(ac) shows the waveform of the voltage present at junction Jc1 during the situation when the fluorescent lamps are in the process of ignition.

Details of Operation

In FIG. 1, regular 120 Volt/60 Hz power line voltage—see FIG. 2(a)—is provided to a bridge rectifier (BR), thereby causing full-wave-rectified unfiltered voltage (i.e., 120-per-second unidirectional half-cycles of the 120 Volt/60 Hz power line voltage) to be provided across terminals DC– and DC+—see FIG. 2(b)—which unidirectional voltage is applied between the DC– bus and the DC+ bus.

In a manner well understood by persons skilled in the art pertinent hereto, the unfiltered unidirectional voltage is transformed (i.e., forward-converted) by way of a periodically switched energy-storing inductor (ESI) to a substantially constant-magnitude DC voltage across an energy-storing capacitor (ESC2).

The switching of the energy-storing inductor is accomplished via a field-effect transistor FETpc gated by a pre-converter IC (PCIC).

In an actual embodiment of the invention of FIG. 1, the pre-converter IC was chosen to be a Motorola MC34262. Detailed information with respect to the design and operation of a preconverter circuit based on an IC such as the Motorola MC34262 is available from Motorola Inc., 2100 E. Elliot Road, Tempe Ariz. 85284.

Pre-converter IC's, such as the MC34262, requires for its proper operation a source of low-magnitude (e.g., 15 Volt) DC power; and, in the absence of a separate source of low-voltage DC power (e.g., a battery), a problem is that of providing such a low-magnitude DC voltage when the only basic source of power is ordinary 120 Volt/60 Hz power line voltage. The IC requires about 10 milli-Ampere of current during normal operation, and drawing that amount of current directly from the DC+ bus would require a dropping resistor of about 0.9 kOhm; which, in turn, would cause an unacceptably high level (over 1.2 Watt) of waisted power dissipation. To minimize such excessive waisted power dissipation, a standard method is that of initiating IC operation by way of slowly charging an energy-storing capacitor (ESC1–typically 47 micro-Farad) from the DC+ bus by way of a relatively high-value resistor (such as 120 kOhm), which reduces waisted power dissipation to a more acceptable level (about 0.1 Watt with 120 kOhm) and then, once the IC starts operation (which it does as soon as the magnitude of its DC supply voltage reaches about 10 Volt), providing continuous DC power to the IC from an auxiliary winding on the energy-storing inductor (ESIa). However, a drawback of this approach is that—if keeping waisted power dissipation to a minimum—it takes about 0.5 second for the requisite energy-storing capacitor to reach a voltage high enough to cause the IC to initiate operation; which amount of time, although definitely objectionable, is less objectionable than an excess power dissipation of about 1.1 Watt.

In the circuit arrangement of FIG. 1, by way of capacitor C1 (4.7 micro-Farad), the 47 micro-Farad energy-storing capacitor ESC1 gets charged-up (without resulting in any wasted power dissipation) to a DC voltage of about 15 Volt within a time period of less that half a complete cycle of the power line voltage, thereby causing the IC to start operation within a few milli-seconds after initial power-up. (The purpose of high-value resistor R1 is that of discharging capacitor C1 after power shut-off, thereby to prevent a possible hang-up.)

Alternatively, capacitor C1 could be connected to the B+ bus instead of to the DC+ bus.

FIG. 2(f) illustrates the development-over-time of the DC voltage provided to the pre-converter IC using the ordinary boot-strap approach designed for a minimum level of waisted power dissipation; while FIG. 2(h) shows the corresponding B+ voltage. FIG. 2(e) illustrates the development-over-time of the DC voltage provided to the pre-converter IC using the preferred minimum-power-dissipation arrangement described hereinabove; while FIG. 2(g) shows the corresponding B+ voltage.

Usually, pre-converter ICPC (e.g., MC34262) operates with only a capacitor (C3—typically 0.22 micro-Farad) connected to its terminal 2 (actually: between its terminal 2 and its "ground" terminal 6—which is connected with the DC– bus). However, with only this capacitor connected between terminal 2 and "ground" (i.e., the DC– bus), the pre-converter's response time is so long as to constitute a serious problem with respect to delivering enough power to provide for proper instant-starting of the two instant-start fluorescent lamps ISFL1 and ISFL2. To mitigate this problem, a positive bias current is provided to the IC's terminal 2 for a brief period of time after power-up; during which brief period of time enough DC power will then be provided to result in proper lamp ignition. This positive bias current is provided to terminal 2 by way of capacitor C2 and resistor R3 for a period of about 100 milli-seconds each time immediately after the power line voltage has been applied to power input terminals PIT1 and PIT2 (i.e., each time right after power-up).

Or, stated differently, setting-up the pre-converter IC (PCIC) so as to cause delivery of the amount of DC power required by the inverter circuit (i.e., the circuit assembly consisting of principal power-handling elements FET1, FET2, L and C) to properly power the two lamps on a steady-state basis (i.e., about 56 Watt), while at the same time causing the current drawn from the power line to have a substantially sinusoidal waveshape during such steady-state operation, will result in a situation where the pre-converter circuit (i.e., the circuit consisting of principal elements BR, PCIC, FETpc, ESI and ESC2) will be incapable of supplying a sufficiently high level of DC power (i.e., about twice the level required for appropriate steady-state operation) during the lamp ignition period, thereby resulting in improper (i.e., life-foreshortening) lamp ignition. However, by supplying the above-indicated positive bias current to terminal 2 of PCIC for a period of about 100 milli-seconds immediately after power-up, adequate DC power for proper lamp ignition (i.e., about 112 Watt) will indeed be provided.

During the brief period positive bias current is being provided to terminal 1 of PCIC, the waveshape of the current drawn from the power line is highly non-sinusoidal. Also, the power factor with which power line current is being drawn during this period is undesirably low. However, since this period only lasts for about 100 milli-seconds each time the circuit is being powered-up, it is functionally non-detrimental. Thus, via the above-described current biasing, proper instant-start-type lamp ignition is attained merely by sacrificing perfection in power line current waveform during the initial 100 milli-seconds.

The waveform of the current drawn from the power line during the initial 100 milli-seconds after power-up is illustrated by FIG. 2(d); which highly non-sinusoidal waveform should be compared with the substantially sinusoidal waveform of the current drawn from the power line during ordinary steady-state operation; which latter waveform is illustrated by FIG. 2(c).

In the pre-converter circuit, with transistor FETc being non-conductive, the particular magnitude to which the DC supply voltage is being regulated is determined by the voltage-dividing ratio represented by resistors R7 and R8, with the magnitude being higher the lower be the resistance of R8 versus that of R7. However, for a brief period after power-up, capacitor C5 causes transistor FETc to be conductive for a brief period; during which brief period resistor R8 gets shunted with resistor R9, thereby causing the magnitude of the DC supply voltage to be higher than usual during this brief period. In particular, with reference to FIG. 2(e), in the preferred embodiment, the magnitude of the DC supply voltage is arranged to be about 300 Volt during the initial 100 milli-seconds after power-up; whereafter it declines to about 240 Volt, at which level it remains constant during normal steady-state operation.

Optionally, to reduce electro-magnetic interference, a low-value (e.g., 100 pico-Farad) capacitor Cx is connected between the DC– bus and the drain terminal of transistor FETpc.

The DC supply voltage provided from the pre-converter circuit is applied across the half-bridge inverter represented by the periodically conducting field-effect transistors FET1 and FET2; which transistors are alternatingly switched ON and OFF by signals provided from inverting buffers IB1a and IB2a, respectively. As a result of the inverting action, and as illustrated by FIGS. 2(m), 2(r) and 2(y) for different situations, an alternating squarewave-like voltage is provided at junction Jx.

Inverting buffer IB1a (as well as each of inverting buffers IB1b, IB1c and IB1d) represents one of the six inverting buffers in an ordinary 16-pin Hex Buffer, such as Motorola MC14049UB. Likewise, inverting buffer IB2a (as well as each of inverting buffers IB2b, IB2c and IB2d) represents one of the six inverting buffers in another such Hex Buffer.

Inverting buffers IB1a, IB1b, IB1c and IB1d get their DC supply voltage from the same DC source as does the pre-converter IC (PCIC); which is to say from across energy-storing capacitor ESC1. Inverting buffers IB1a, IB1b and IB1c are connected together in a manner such as to make them self-oscillate in a squarewave-like manner by way of capacitive positive feedback provided by feedback capacitor FC1 combined with negative resistive feedback provided by resistor R20 as well as (optionally) resistor Ro1 and diode Do1. Timing of the oscillation is determined by the capacitance of capacitor FCi as combined with the resistance of resistor R20 as combined with optional resistor Ro1 and optional diode Do1. More particularly, for a given capacitor FC1, and absent any action which might be provided by way of diode D5, the length of time during which the output voltage of inverting buffer IB1*a* is low (i.e., causing the gate voltage provided to the gate of transistor FET1 to be of zero magnitude) is determined by resistor R20, and is arranged to be on the order of 10 milli-seconds; which is long enough for tank-capacitor C to be charged-up (via resistor R11) to a magnitude substantially equal to that of the B+ voltage.

With tank-capacitor C charged-up to the B+ voltage, suddenly the output of inverting buffer IB1*a* changes from low to high, thereby applying a voltage to the gate of FET1 of sufficient magnitude to cause FET1 to become conductive, thereby causing the charge on tank-capacitor C to be applied across tank-inductor L, thereby establishing a sinusoidally-shaped current in tank-inductor L. If FET1 were to remain conductive, this sinusoidally-shaped current would just oscillate at the natural resonance frequency of the L-C tank circuit, eventually to dissipate. However, the sinusoidally-shaped current will be reflected as a sinusoidally-shaped voltage across capacitor CC1; which sinusoidally-shaped voltage will be applied to the input of inverting buffer IB1*d*; whose output will—via capacitor C7 and diode D6—cause the output of inverting buffer IB1*a* to go low (thereby causing FET1 to become non-conductive) at some point prior to the sinusoidally-shaped current flowing through tank-inductor L having completed its first half-cycle.

With transistor FET1 being conductive (i.e., with FET1 in its ON-condition), junction Jx is pulled down to the potential of the DC– bus, thereby causing capacitor ESFC to be charged via rectifier HSR2 to the DC voltage provided at the A+ bus (i.e., to about 15 Volt).

Due to action provided via inverting buffer IB1*d*, FET1 will be switched OFF while forward current is still flowing through it. Since this forward current is also flowing through tank-inductor L, it must (after FET1 enters its OFF-condition) find an alternative path through which it can flow; which alternative path will be through the reverse-current shunting diode built into FET2.

Thus, immediately after FET1 is switched OFF, junction Jx is pulled up to the potential of the B+ bus. Moreover, due to the very fact that junction Jx gets pulled up to the B+ voltage, rectifier HSR3 gets electrically disconnected from the input of inverting buffer IB2*c*. (This is so for the reason that the potential of this rectifier's anode goes highly negative with respect to its cathode as a result of junction Jx being pulled up to the potential of the B+ bus.) With rectifier HSR3 thusly disconnected, the input of inverting buffer IB2*c* is free to be pulled down by the loading represented by resistor R28. In actuality, the input of inverting buffer IB2*c* is pulled down far enough to cause the IB2*a*/IB2*b*/IB2*c* assembly to reverse state and cause the input to IB2*c* to abruptly go low before the magnitude of the inductor current shunted through FET2's shunting diode has reached zero; which means that FET2 switches ON before the magnitude of the reverse-current flowing through its shunting diode reaches zero.

In other words, the very act of switching transistor FET1 OFF (i.e., causing it to enter its OFF-condition) leads transistor FET2 to be switched ON, but only after the absolute magnitude of the voltage across it (i.e., between it source terminal and its drain terminal) has fallen to a level lower than the absolute magnitude of the DC voltage present on the A'+ bus (i.e., the DC voltage present across capacitor ESFC, or between junction Jx and the A'+ bus). Thus, transistor FET2 switches ON only after the magnitude of the voltage across it has declined to some level lower than 15 Volt.

After having been switched ON, transistor FET2 remains in its ON-condition until caused to be switched OFF by action derived from the feedback voltage present at the output of winding LW2; which feedback voltage is of the waveshape illustrated by FIGS. 2(*p*), 2(*u*) and 2(*ab*).

By way of resistor R26 and capacitor Cc2, the feedback voltage is integrated such as to provide across capacitor Cc2 a derived voltage having an instantaneous magnitude substantially proportional to that of the current flowing through tank-inductor L. Thus, the waveshape of the derived voltage is substantially equal to that of the current flowing through tank-inductor L; which waveshape is illustrated by FIGS. 2(*q*), 2(*v*) and 2(*ac*). This derived voltage is applied via resistor R25 (whose purpose is that if providing isolation so as not to interfere with the integration process provided by resistor R26 and capacitor Cc2) to the input of inverting buffer IB2*d*, thereby to be "squared-up" such as to cause a squarewave-like voltage to be provided at the output of IB2*d*; each positive-going wavefront of which squarewave-like voltage is used—by way of the bi-stable inverting circuit represented by inverting buffers IB2*b*, IB2*c* and IB2*a*—to switch transistor FET2 into its OFF-condition. The exact phase delay provided by the integration circuit (i.e., by resistor R26 and capacitor Cc2) is so chosen as to cause transistor FET2 to be switched OFF just before the magnitude of the current flowing through tank-inductor L (as well as through transistor FET2) reaches the zero-crossing of its waveform. Typically, the switch-OFF point is chosen to be about 20 degrees ahead of the zero-crossing.

Thus, transistor FET2 is initiated into its ON-state by transistor FET1 being switched OFF. However, it enters this ON-state only after the absolute magnitude of the voltage across it has diminished to a relatively low level. Subsequently, transistor FET2 is initiated into its OFF-state by action of the current flowing through tank-inductor L and at a time just prior to the instantaneous magnitude of this current reaching zero (i.e., just prior to a zero-crossing of the waveform of the current flowing though the tank-inductor).

Similarly, with the help of diode D12, resistor R24 and capacitor C7, transistor FET1 is initiated into its ON-state by transistor FET2 being switched OFF; and, also similarly, transistor FET1 enters this ON-state only after the absolute magnitude of the voltage across it has diminished to a relatively low level. Subsequently, absent over-riding control action supplied via diode D9, transistor FET1 is—with the help of winding LW1, resistor R19, capacitor Cc1 and inverting buffer IB1*d*, all acting in the manner described above in connection with the control of transistor FET2—initiated into its OFF-state by action of the current flowing through tank-inductor L at a time just prior to the instantaneous magnitude of this current reaching zero.

As a result of the above-indicated alternating switching-ON and switching-OFF of transistors FET1 and FET2, a squarewave-like voltage is developed at junction Jx (i.e., between junction Jx and the DC– bus); which squarewave-like voltage is illustrated by FIGS. 2(*m*), 2(*r*) and 2(*y*) under different circumstances; which different circumstances come about as a result of different control actions provided via diode D9.

More particularly, the squarewave-like voltage at junction Jx will give rise to series-resonant action in the tuned L-C circuit consisting of tank-inductor L and tank-capacitor C; which series-resonant action will give rise to a substantially sinusoidal current flowing through tank-inductor L and tank-capacitor C; which substantially sinusoidal current will, in turn, cause a substantially sinusoidal voltage to develop across tank-capacitor C; which substantially sinusoidal voltage is hereinafter sometimes referred-to as the AC rail voltage.

With the natural resonance frequency of the L-C circuit being approximately equal to (or slightly lower than) the fundamental frequency of the squarewave-like voltage at junction Jx, the magnitude of the AC rail voltage will—as a result of so-called Q-multiplication caused by series-resonant action—be much higher than the magnitude of the fundamental frequency component of the squarewave-like voltage at junction Jx. By way of a voltage divider consisting of resistor R12 and R13, a small fraction of the AC rail voltage is applied to the base of transistor Qc1, thereby causing pulses of current to flow through resistor R14; which current pulses, in turn, give rise to negative-going voltage pulses at the collector of transistor Qc1. In proportion to the degree by which the magnitudes of these negative-going voltage pulses decline (or penetrate) below a certain threshold level (as pre-determined by Zener diode Z1), corresponding current pulses are provided to the base of transistor Qc2, thereby developing a positive (i.e., positive with respect to the DC– bus) control voltage at the collector of transistor Qc2. The magnitude of this positive control voltage is proportional to the degree by which the negative-going voltage pulses penetrate below said threshold level. As soon as the magnitude of the positive control voltage present at the collector of transistor Qc2 exceeds a certain level, by action delivered through diode D9, the switching-OFF of transistor FET1 will happen earlier than it would otherwise have happened by the action derived from the output of winding LW1 and ultimately delivered through diode D6.

As a result of the action of the control voltage, the magnitude of the AC rail voltage will be maintained at a substantially constant level, essentially regardless of the amount of load power drawn from the AC rail, as long as that amount of load power stays below a certain maximum level. In a particular version of the preferred embodiment, the magnitude of the AC rail voltage is controlled to remain at about 550 Volt RMS; which particular magnitude is determined by the voltage divider represented by resistors R12 and R13 in combination with the magnitude of the Zener voltage of Zener diode Z1. With an AC rail voltage of 550 Volt RMS, the two parallel-powered T-8/F32 Instant-Start fluorescent lamps ISFL1 and ISFL2 (u.e., lamps such as 48" GTE/Sylvania's so-called Octron lamps) are ignited properly, which is to say within 50 milli-seconds after initial application of lamp voltage. (While lamp ignition is taking place, the power drawn by each Instant-Start lamp is about twice as high as it is during normal steady-state lamp operation.)

The amount of power available from the AC rail depends on two main factors: (i) the magnitude of the DC supply voltage; and (ii) the ratio between the ON-time of the FET1 transistor versus the ON-time of the FET2 transistor, hereinafter sometimes referred-to as the ON1/ON2 ratio. For a given DC supply voltage, the maximum power available from the AC rail occurs when this ON1/ON2 ratio is unity—assuming resonance of tank-inductor L and tank-capacitor C. Thus, for a given DC supply voltage, to accommodate lower-than-maximum amounts of power drawn from the AC rail, the ON-time of the FET1 transistor must be shortened (i.e., the ON1/ON2 ratio must be reduced); which automatically causes the ON-time of the FET2 transistor to lengthen—as indicated by comparing FIGS. 2(m), 2(r) and 2(y)—and the inversion frequency to remain substantially constant.

To minimize circulating power (i.e., Volt-Ampere product) in the L-C tank circuit during normal lamp operation—thereby to minimize power dissipation in the L-C tank circuit—it is necessary to minimize the capacitance-value of tank-capacitor C and maximize the inductance-value of tank-inductor L. Best efficiency during normal steady-state lamp operation occurs when the ON1/ON2 ratio is about unity while at the same time the magnitude of the DC supply voltage has been reduced to the level commensurate with this unity ON1/ON2 ratio at the particular amount of power drawn.

However, with the ON1/ON2 ratio being near unity at normal steady-state lamp operation, there would be no room to provide for the required extra power for lamp ignition, except by increasing the magnitude of the DC supply voltage.

In fact, for a brief period immediately following initial power-up—by virtue of the effect provided by transistor FETc in combination with circuit elements R9, R10, Zc and C5—the magnitude of the DC supply voltage (i.e., the voltage present between the DC– bus and the B+ bus) is substantially higher than it is during subsequent steady-state operation; which effect is illustrated by FIG. 2(g). More particularly, as a result of the action of transistor FETc, resistor R9 is placed in shunt with resistor R8 for as long as it takes the charge on capacitor C5 to diminish such as to cause transistor FETc to become non-conductive. And, of course, as long as resistor R9 shunts resistor R8, the pre-converter circuit causes the magnitude of the DC supply voltage to be regulated at a level higher than what it be with resistor R9 is not so shunting resistor R8.

Yet, immediately after power-up, during the brief period within which the Instant-Start fluorescent lamps (ISFL1 and ISFL2) should be fully ignited, by virtue of the relatively long time-constant associated with capacitor C3—whose purpose is to minimize harmonic distortion of the power line current drawn from the power line during steady-state operation—the magnitude of the DC supply voltage is prevented from fully reaching the magnitude required for proper instant-starting of the lamps, thereby giving rise to substantial fore-shortening of lamp life. To obviate this problem, immediately after power-up (i.e., as the magnitude of the DC voltage at the A+ bus increases to its operating level), a positive bias current is supplied to PCIC's terminal 2 (to which capacitor C3 is connected) for a period long enough to permit the lamps to be properly ignited; which positive bias current is supplied via the sub-circuitry represented by circuit elements C2, R3 and D3. This sub-circuitry functions to disable the above-indicated time-constant-effect of capacitor C3 for a period long enough for the lamps to fully ignite. Thereafter, as soon as capacitor C2 has been charged to a steady-state level, capacitor C3 assumes its normal function.

Thus, for an initial brief period immediately following power-up, the current drawn from the power line will not be waveform-corrected so as to result in a minimum amount of harmonic distortion. In fact, as illustrated by FIG. 2(d), during this initial period—whose duration will typically be between 10 and 100 milli-seconds—the current drawn from the power line will have a distinctly non-sinusoidal waveshape; whereas, after this initial brief period, as illustrated by FIG. 2(c), its waveshape will be substantially sinusoidal.

Additional Comments (a) With reference to the circuit of FIG. 1, the effect of the optional sub-circuitry represented by elements OQc1, Ry, Z2 and Rs is—after the lamps have been fully ignited—to cause the magnitude of the AC rail voltage to be lowered as long as both lamps draw current. The purpose of doing so is that of increasing operating efficiency; which operating efficiency is highly dependent upon the steady-state magnitude of the AC rail voltage. More particularly, most of the power dissipation incurred in the circuit of FIG. 1 result from power losses associated with reactive power circulating in the L-C tank circuit; which power losses are proportional to the square of the magnitude of the AC rail voltage.

For proper lamp ignition, the magnitude of the AC rail voltage has to be of a certain minimum level (e.g., at least 500 Volt RMS for the 48" Octic lamps represented by ISFL1 and ISFL2); yet, for proper steady-state lamp operation the magnitude of the AC rail voltage need not be any higher than about half this certain minimum level (which would imply a reduction of power losses in the L-C tank circuit by a factor of four). Yet, to provide for ignition of a lamp that is removed and then replaced, it is necessary to maintain the AC rail voltage at a sufficiently high magnitude to cause lamp ignition until the last lamp has been connected. However, after all lamps have been connected and properly ignited, it is indeed permissible to reduce the magnitude of the AC rail voltage (thereby to reduce the power dissipation resulting from circulating reactive power in the L-C tank circuit), but only if this magnitude be increased back to a higher level (i.e., a level high enough-at least barely—to cause ignition) in case a lamp were to be removed.

In the circuit of FIG. 1, when both lamps are connected and drawing current, the magnitude of the AC rail voltage is reduced by about one third, thereby reducing the power losses of the L-C tank circuit by a factor of two or so. However, if one of the lamps were to be removed, the magnitude of the AC rail voltage would increase by about 50% and remain at such higher level until the lamp be replaced.

(b) Instead of using a single sensor means—such as Rs—to sense flow of current through both (or all) lamps, it may under some circumstances be advantageous to use a lamp current sensor for each lamp and then combining all the sensor outputs in an "and" circuit; which "and" circuit would then function to cause the magnitude of the AC rail voltage to decrease.

(c) Usually, if a pre-converter be used in an electronic ballast, the power handling capability of this pre-converter would be matched to the steady-state power requirements. However, pre-converters are not normally used in electronic ballasts intended to power Instant-Start fluorescent lamps.

For proper lamp ignition, it has been found that an instant-Start fluorescent lamp requires during the ignition period—which typically may last from 30 to 50 milli-seconds—about twice the power required by that same lamp on a steady-state basis. Thus, an ordinary 28 Watt Octic fluorescent lamp requires about 56 Watt during its 30–50 milli-second ignition period. More particularly, within about a milli-second after having been connected with its (current-limited) voltage source, an instant-Start fluorescent lamp ionizes and—to the extent available from this voltage source—draws nearly full normal lamp current. However, for the first 30–50 milli-seconds, the magnitude of the voltage across the lamp is more than twice as nigh as its normal operating voltage; which excess lamp-voltage-drop is due to excess cathode-voltage-drops due, in turn, to the fact that the lamp cathodes have not yet reached incandescence. As soon as each of the cathodes develops an incandescent spot (i.e., a so-called "hot-spot") from which thermionic emission is produced, the excess cathode-voltage-drops disappears.

For a 48" Octic fluorescent lamp, the normal steady-state lamp operating voltage is about 140 Volt RMS. During the 30–50 milli-second ignition period, however, the lamp voltage is about 340 Volt RMS; which excess voltage of about 200 Volt—when multiplied with the lamp current—represents excess power operative to effect rapid heating of the lamp's thermionic cathodes.

Thus, with a nominal ignition period of (say) 40 milli-seconds, with a 100 Volt excess cathode-voltage-drop at (say) 175 milli-Ampere lamp current, each cathode receives in effect a total of 0.7 Joule of heating energy; which amount of cathode heating energy is comparable to the amount of cathode heating energy being supplied to each of the cathodes of a corresponding Rapid-Start fluorescent lamp during the initial 0.7 second or so—whereafter lamp ignition is effected.

In other words, for proper ignition of an Instant-Start fluorescent lamp, the cathodes should be super-rapid-heated by way of forcing near full-magnitude lamp current through the lamp's cold cathodes; thereby establishing a thermionic cathode hot-spot in 30–50 milli-seconds.

Such super-rapid-heating of the lamp cathodes is exactly what is accomplished by the circuit of FIG. 1.

(d) FIG. 1 consists of two parts: a firs part referred-to as Pre-Converter Circuit, and a second part referred-to as Inverter Circuit.

In the first part, the Pre-Converter per se consists of all the parts shown, except for power source S and elements ISFL1, ISFL2, BC1, BC2 and Rs.

In the second part, the Inverter Circuit consists of all the parts shown.

(e) The operation of the Inverter Circuit is based on current flowing through the tank-inductor each time at the moment when one of the inverter transistors (FET1, FET2) switches OFF. The switching-OFF of this inductor current by one of the transistors provides the very mechanism operative subsequently to cause the other one of the transistors to be initiated into forward conduction.

More particularly, for the Inverter Circuit to function, each of switching transistors FET1 and FET2 must be switched OFF at a moment when it is conducting current in its forward direction; which current must at that moment also be flowing through an energy-storing inductor (i.e., the tank-inductor). Then, immediately after one of the switching transistors is switched OFF, due to the inductive nature of the current just previously having flown forward through that transistor, this same current will now find its way through the other switching transistor in the form of a reverse current; which reverse current is permitted to flow freely through this other transistor by way of the reverse-poled shunting diode built into ordinary field-effect switching transistors, such as FET1 and FET2.

Of course, whenever reverse current is flowing through one of the switching transistors, the absolute magnitude of the voltage existing across this transistor can not be any higher than the voltage-drop associated with that transistor's built-in shunting diode.

(f) An important feature of the Inverter Circuit is that each of the switching transistors is manifestly prevented from being brought into a state of forward conduction until after the absolute magnitude of any voltage present across this transistor has been reduced to a level substantially lower than the absolute magnitude of the DC supply voltage.

More particularly and by way of example, in the inverter circuit of FIG. 1, with the magnitude of the DC supply voltage being about 300 Volt, each of the switching transistors (FET1, FET2) can be brought into conduction only after the absolute magnitude of the voltage across this transistor has diminished to well below 15 Volt.

(g) With reference to FIGS. 2(m), 2(r) and 2(y), which depict waveforms of the voltage present across transistor FET1 under different operating conditions, it is noted that the average magnitude of the voltage present across transistor FET1 changes; the average magnitude being relatively high under the condition of FIG. 2(m), significantly lower under the condition of FIG. 2(r), and lower yet under the condition of FIG. 2(y).

The average magnitude of the voltage present across transistor FET1 is defined as the average magnitude obtained when averaging this voltage over a complete period of the voltage waveform.

(h) As with any periodic waveform, each of the voltage waveforms depicted by FIGS. 2(m), 2(r) and 2(y) contains a fundamental voltage component and various harmonic (i.e., 2nd harmonic, 3rd harmonic, 4th harmonic, etc.) voltage components. The magnitude of the fundamental voltage component of the waveform of FIG. 2(m) is relatively small; the magnitude of the fundamental voltage component of the waveform of FIG. 2(r) is of an intermediary level; and the magnitude of the fundamental voltage component of the waveform of FIG. 2(y) is relatively large.

The magnitude of the fundamental voltage component of the periodic voltage present across transistor FET1—which is equivalent to the alternating voltage provided across the L-C tank-circuit—is controllable over a continuous range by way of controlling the duration of the ON-time (i.e., the forward conduction time) of transistor FET1 versus the duration of the ON-time (i.e., the forward conduction time) of transistor FET2.

(i) In FIG. 1, a capacitor is illustrated is phantom (i.e., dashed) as shunting transistor FETpc. Another capacitor is similarly shown to shunt transistor FET1. The purpose of these capacitors (which capacitors are optional) is that of minimizing Electro-Magnetic Interference ("EMI"). However, for optimum effect, the capacitors should be relatively dissipative; or, alternatively, a resistor (i.e., about 100 Ohm) should be connected in series with each capacitor.

(j) In FIG. 1, a Zener diode is illustrated in phantom (i.e., dashed) as shunting resistor R10. The purpose of this Zener diode (which Zener diode is generally optional, but may be required in some cases) is that of preventing the magnitude of the gate voltage from exceeding specified limits.

(k) The term "power-up" refers to the action of making initial connection between the circuit arrangement of FIG. 1 and the power line.

I claim:

1. An arrangement comprising:

a pre-conditioner circuit having a pair of power input terminals connected with the AC power line voltage of an ordinary electric utility power line; the preconditioner circuit being (i) characterized by including an intermittently conducting transistor; (ii) operative to provide a DC supply voltage of substantially constant magnitude at a pair of DC output terminals; and (iii) by not having a transformer winding connected across the power input terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

2. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) a waveshaping subassembly connected between the intermediary terminals and the AC output terminals and functional to cause the AC output voltage to have a substantially sinusoidal waveshape; and a first gas discharge lamp connected across the AC output terminals by way of a first current-limiting impedance.

3. The arrangement of claim 2 wherein a second gas discharge lamp is connected across the AC output terminals by way of a second current-limiting impedance.

4. The arrangement of claim 2 wherein the preconditioner circuit is additionally characterized by including an intermittently conducting transistor.

5. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit also being characterized by including a pre-converter control circuit operative, in response to a pre-converter control signal, to control the magnitude of the DC supply voltage;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

6. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) an inverter control circuit operative to control the magnitude of the AC output voltage independently of the magnitude of the DC control voltage; and a first gas discharge lamp connected across the AC output terminals by way of a first current-limiting impedance.

7. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by providing for the magnitude of the DC supply voltage to be substantially higher during a brief period immediately following initial connection of the power input terminals with the AC power line voltage as compared with after this brief period;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) a waveshaping subassembly connected between the intermediary terminals and the AC output terminals and functional to cause the AC output voltage to have a substantially sinusoidal waveshape; and a first gas discharge lamp connected across the AC output terminals by way of a first current-limiting impedance.

8. The arrangement of claim 7 wherein the duration of the brief period is on the order of one minute or less.

9. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by not having a transformer winding connected across the power input terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) an IC having IC terminals connected in circuit with the first pair of transistor control terminals;

a first gas discharge lamp connected across the AC output terminals by way of a first current-limiting impedance.

10. The arrangement of claim 9 wherein the inverter circuit is still further characterized by: (i) the DC input terminals being represented by a positive DC input terminal and a negative DC input terminal; (ii) one of the first pair of transistor output terminals being connected with one of the second pair of transistor output terminals, thereby to form a joint output terminal; (iii) the other one of the first pair of transistor output terminals being connected with the positive DC input terminal; (iv) the other one of the second pair of transistor output terminals being connected with the negative DC input terminal; and (v) at least one of the IC terminals being connected with the joint output terminal.

11. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; (iv) a first IC having a first set of IC terminals connected in circuit with the first pair of transistor control terminals; and (v) a second IC having a second set of IC terminals connected in circuit with the second pair of transistor control terminals; and a first gas discharge lamp connected across the AC output terminals by way of a first current-limiting impedance.

12. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) a sub-assembly operative, at least at certain times, to cause the duration of the firt part to be substantially different from the duration of the second part; and a first gas discharge lamp connected across the AC output terminals by way of a first current-limiting impedance.

13. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) a sub-assembly operative, in response to receiving a control action at a control input, to control the ratio between the duration of the first part and the duration of the second part; and a first gas discharge lamp connected across the AC output terminals by way of a first current-limiting impedance.

14. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by including a pre-converter control circuit operative operative to control the magnitude of the DC supply voltage independently of the magnitude of the AC power line voltage;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and (iv) an inverter control circuit operative to control the magnitude of the AC output voltage independently of the magnitude of the DC supply voltage; and a first gas discharge lamp connected across the AC output terminals by way of a first current-limiting impedance.

15. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by: (i) for a brief period immediately after having been connected with the AC power line voltage, drawing non-sinusoidal current from the power line: (ii) after the brief period, drawing a substantially sinusoidal current from the power line; and (iii) not having a transformer winding connected across its power input terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

16. The arrangement of claim 15 wherein the brief period endures for plural complete cycles of the AC power line voltage.

17. (Amended) An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by: (i) for a brief period immediately after having been connected with the AC power line voltage, drawing power from the power line at a relatively high rate; (ii) after the brief period, drawing power from the power line at a relatively low rate; the Drier period having a duration equal to that of plural complete cycles of the AC power line voltage; and (iii) not having a transformer winding connected across the power input terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

18. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by not having a transformer winding connected across the power input terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by being operative: (a) for a brief period immediately after the pre-converter circuit having been connected with the AC power line voltage, to cause the magnitude of the AC output voltage to be relatively high; and (b) after the brief period, to cause the magnitude of the AC output voltage to be relatively low; and a first gas discharge lamp connected across the AC output terminals by way of a first current-limiting impedance.

19. The arrangement of claim 18 wherein the duration of the brief period is on the order of 50–100 milli-seconds output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

20. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized by including: (i) a pre-converter transistor; (ii) an energy-storing inductor; (iii) an IC connected with the pre-converter transistor and functional, but only after having been provided with an auxiliary DC supply voltage, to cause the pre-converter transistor to periodically conduct; and (iv) an auxiliary DC power supply operative to supply said auxiliary DC supply voltage within a short period of time after the power input terminals have been connected with the AC power line voltage; the short period of time being about equal to or shorter than the duration of a complete cycle of the AC power line voltage; any power drawn from the auxiliary DC power supply having been supplied from the power line;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

21. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by: (a) causing the AC output voltage to be substantially sinusoidal; (b) including a tank-inductor series-connected with a tank-capacitor to form an L-C circuit having a natural resonance frequency at or near the fundamental frequency of the AC output voltage; (c) having a first auxiliary winding coupled with the tank-inductor, the first auxiliary winding having a first pair of auxiliary terminals across which exists a non-sinusoidal voltage of frequency equal to that of the AC output voltage; and (d) having a first subcircuit connected between the first pair of auxiliary terminals and the first pair of transistor control terminals, the first sub-circuit being operative to provide a first control voltage to the first transistor control terminals, the first control voltage being characterized by alternating periodically between two voltage levels, spending substantially no time at any other voltage levels; and a first gas discharge lamp connected across the AC output terminals by way of a first current-limiting impedance.

22. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by: (a) including a tank-inductor series-connected with a tank-capacitor to form an L-C circuit having a natural resonance frequency at or near the fundamental frequency of the AC output voltage; (b) having a first auxiliary winding coupled with the tank-inductor, the first auxiliary winding having a first pair of auxiliary terminals across which exists a non-sinusoidal voltage of frequency equal to that of the AC output voltage; and (c) having a first sub- 23. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by: (a) including a tank-inductor series-connected with a tank-capacitor to form an L-C circuit having a natural resonance frequency at or near the fundamental frequency of the AC output voltage; (b) having a first auxiliary winding coupled with the tank-inductor, the first auxiliary winding having a first pair of auxiliary terminals; (c) having a second auxiliary winding coupled with the tank-inductor, the second auxiliary winding having a second pair of auxiliary terminals; (d) having a first sub-circuit connected between the first pair of auxiliary terminals and the first pair of transistor control terminals; and (e) having a second sub-circuit connected between the second pair of auxiliary terminals and the second pair of transistor control terminals; and a first gas discharge lamp connected across the AC output terminals by way of a first current-limiting impedance.

24. The arrangement of claim 23 wherein at least one of the sub-circuits is characterized by including an amplifier.

25. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by: (a) including an inductor through which an alternating inductor current is flowing; (b) having a first auxiliary winding coupled with the inductor, the first auxiliary winding having a first pair of auxiliary terminals across which exists an alternating auxiliary voltage of frequency equal to that of the AC output voltage, the alternating auxiliary voltage having a waveshape substantially different from that of the alternating inductor current; (c) having a first sub-circuit connected between the first pair of auxiliary terminals and the first pair of transistor control terminals, the first sub-circuit having a first pair of subterminals across which exists an alternating sub-circuit voltage having a waveshape substantially equal to that of the alternating inductor current; and a first gas discharge lamp connected across the AC output terminals by way of a first current-limiting impedance.

26. The arrangement of claim 25 wherein the alternating inductor current has a substantially sinusoidal waveshape.

27. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by: (a) the first transistor being operative, but only when receiving a first control voltage at its transistor control terminals, to cause current to flow in a forward direction between its transistor output terminals; and (b) including control circuitry operative to provide the first control voltage only after the absolute magnitude of any voltage existing across its output terminals has become substantially lower than that of the DC supply voltage; and a first gas discharge lamp connected across the AC output terminals by way of a first current-limiting impedance.

28. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; the inverter circuit being further characterized by: (a) including an inductor through which flows an alternating inductor current, each complete cycle of the inductor current having a substantially sinusoidal waveform starting at zero degrees and ending at 360 degrees, with zero degrees, 180 degrees, 360 degrees, etc. representing zero-crossings of the substantially sinusoidal current waveform; (b) having a first control circuit operative to cause the first transistor to conduct current between its output terminals during each period extending between zero degrees and X degrees, where X is a number smaller than 180; and (c) having a second control circuit operative to cause the second transistor to conduct current between its output terminals during each period extending between 180 degrees and Y degrees, where Y is a number larger than 180 but smaller than 360; and a first gas discharge lamp connected across the AC output terminals by way of a first current-limiting impedance.

29. The arrangement of claim 28 wherein: (i) X is larger than 156 and smaller than 176; and (ii) Y is larger than 210 and smaller than 350.

30. The arrangement of claim 28 wherein, under a first stable condition, the difference between Y and X equals a number substantially different from 180.

31. The arrangement of claim 28 wherein, under a second stable condition, the difference between Y and X substantially equals 180.

32. The arrangement of claim 28 wherein: (i) the first transistor conducts current, in one direction or the other, between its output terminals over a first part of the complete cycle; (ii) the second transistor conducts current, in one direction of the other, between its output terminals over a second part of the complete cycle; (iii) the angular sum of the the first part and the second part equals 360 degrees; and (iv) under a first stable condition, the duration of the first part is substantially different from that of the second part.

33. The arrangement of claim 28 wherein: (i) the first control circuit includes a first IC; (ii) the second control circuit includes a second IC; and (iii) the first IC is different from the second IC.

34. The arrangement of claim 28 wherein a first auxiliary winding is magnetically coupled with the inductor and connected with the first control circuit.

35. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; under at least under one stable operating condition, the inverter circuit being further characterized by: (a) having an inverter output terminal connected with one of the first pair of transistor output terminals as well as with one of the second pair of transistor output terminals; (b) being operative to cause a periodically alternating current to flow from the inverter output terminal; the periodically alternating current having an instantaneous magnitude and a fundamental period; each fundamental period being represented by a waveform divided into 360 equal time divisions; the periodically alternating current flowing either between the first pair of transistor output terminals or between the second pair of transistor output terminals; and (c) having a control circuit connected with the first pair of transistor control terminals as well as with the second pair of transistor control terminals; the control circuit being operative such that, once during each complete fundamental period: (i) at a first point in time, as the periodically alternating current is flowing between the first pair of transistor output terminals and has a first instantaneous magnitude, to cause abrupt cessation of flow of the periodically alternating current between the first pair of transistor output terminals, thereby to cause the periodically alternating current to be diverted so as to flow instead between the second pair of transistor output terminals, and (ii) at a second point in time, as the periodically alternating current is flowing between the second pair of transistor output terminals and has a second instantaneous magnitude, to cause abrupt cessation of flow of the periodically alternating current between the second pair of transistor output terminals, thereby to cause the periodically alternating current to be diverted so as to flow instead between the first pair of transistor output terminals; the first instantaneous magnitude being substantially different from the second instantaneous magnitude; and a first gas discharge lamp connected across the AC output terminals by way of a first current-limiting impedance.

36. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; under at least one steady-state operating condition, the inverter circuit being further characterized by: (a) having an inverter output terminal connected with one of the first pair of transistor output terminals as well as with one of the second pair of transistor output terminals; (b) being operative to cause a periodically alternating current to flow from the inverter output terminal; the periodically alternating current having an absolute instantaneous magnitude and a fundamental period; the alternating current flowing either between the first pair of transistor output terminals or between the second pair of transistor output terminals; and (c) having a control circuit connected with the first pair of transistor control terminals as well as with the second pair of transistor control terminals; the control circuit being operative such that, once during each complete fundamental period: (i) at a first point in time, as the alternating current is flowing between the first pair of transistor output terminals and has a first instantaneous magnitude, to cause abrupt cessation of flow of the alternating current between the first pair of transistor output terminals, thereby to cause the alternating current to be diverted so as to flow instead between the second pair of transistor output terminals, and (ii) at a second point in time, as the alternating current is flowing between the second pair of transistor output terminals and has a second instantaneous magnitude, to cause abrupt cessation of flow of the alternating current between the second pair of transistor output terminals, thereby to cause the alternating current to be diverted so as to flow instead between the first pair of transistor output terminals; the first instantaneous magnitude being substantially different from the second instantaneous magnitude; and a first gas discharge lamp connected across the AC output terminals by way of a first current-limiting impedance.

37. An arrangement comprising:

a pre-conditioner circuit having a pair of power input terminals adapted to be connected with the AC power line voltage of an ordinary electric utility power line; the pre-conditioner circuit, when indeed so connected, being operative to provide a DC supply voltage of substantially constant magnitude at a pair of DC output terminals; the pre-conditioner circuit being further characterized in that, for a brief period immediately following initial power up, the magnitude of the DC supply voltage is substantially higher than it is subsequent to said brief period; the pre-conditioner circuit also being characterized by not having a transformer winding connected across the power input terminals;

an inverter circuit having a pair of DC input terminals connected with the DC output terminals, thereby to provide the DC supply voltage across the DC input terminals; the inverter circuit being operative to provide an AC output voltage at a pair of AC output terminals and being otherwise characterized by including: (i) a first transistor having a first pair of transistor control terminals and a first pair of transistor output terminals; (ii) a second transistor having a second pair of transistor control terminals and a second pair of transistor output terminals; and (iii) a pair of intermediary terminals across which exists a voltage alternating periodically between a first voltage level and a second voltage level, spending a first part of each period at the first voltage level, a second part of each period at the second voltage level, and substantially no time at any other voltage levels; and a first gas discharge lamp connected across the AC output terminals by way of a first current-limiting impedance.

38. The arrangement of claim 37 wherein the duration of the brief period is no longer than about one second.

39. The arrangement of claim 37 wherein the magnitude of the DC voltage is at least 25 percent higher during the brief period than it is during subsequent steady-state operation.

* * * * *